United States Patent
Ido et al.

(10) Patent No.: US 9,642,242 B2
(45) Date of Patent: May 2, 2017

(54) POWER CONVERSION APPARATUS

(71) Applicants: Yusaku Ido, Gifu (JP); Takashi Yamada, Gifu (JP); Akihiro Fujiwara, Aichi (JP)

(72) Inventors: Yusaku Ido, Gifu (JP); Takashi Yamada, Gifu (JP); Akihiro Fujiwara, Aichi (JP)

(73) Assignee: OMRON AUTOMOTIVE ELECTRONICS CO., LTD., Aichi (JP)

( * ) Notice: Subject to any disclaimer, the term of this patent is extended or adjusted under 35 U.S.C. 154(b) by 0 days.

(21) Appl. No.: 14/957,935

(22) Filed: Dec. 3, 2015

(65) Prior Publication Data

US 2016/0165716 A1 Jun. 9, 2016

(30) Foreign Application Priority Data

Dec. 3, 2014 (JP) ................................ 2014-244744

(51) Int. Cl.
*H05K 1/02* (2006.01)

(52) U.S. Cl.
CPC ..... *H05K 1/0272* (2013.01); *H05K 2201/064* (2013.01)

(58) Field of Classification Search
CPC ........... H05K 1/02; H05K 1/0272; H05K 7/20
USPC ................................. 361/141, 699, 721, 722
See application file for complete search history.

(56) References Cited

U.S. PATENT DOCUMENTS

| 5,091,823 A | * | 2/1992 | Kanbara | ................. | H02M 5/44 |
| | | | | | 174/351 |
| 2011/0202220 A1 | * | 8/2011 | Seta | ......................... | B60L 1/00 |
| | | | | | 701/22 |
| 2013/0334879 A1 | | 12/2013 | Ido et al. | | |
| 2015/0029666 A1 | | 1/2015 | Kosuga et al. | | |

FOREIGN PATENT DOCUMENTS

| JP | 2009-027901 A | 2/2009 |
| JP | 2013-099053 A | 5/2013 |
| JP | 2013-211943 A | 10/2013 |
| JP | 2014-003750 A | 1/2014 |

* cited by examiner

*Primary Examiner* — Dion R Ferguson
*Assistant Examiner* — Mandeep S Buttar
(74) *Attorney, Agent, or Firm* — Osha Liang LLP

(57) ABSTRACT

An AC/DC converter of a power conversion apparatus includes filters, a PFC circuit, a first full bridge circuit, a first transformer, and a first rectifier circuit and converts an AC voltage supplied from the outside to a DC voltage. A DC/DC converter includes filters, a second full bridge circuit, a second transformer, and a second rectifier circuit and lowers a DC voltage output from the AC/DC converter. Constituent circuits of the AC/DC converter located on the primary side of the first transformer are mounted on the upper face of a cooling chassis which cools both the converters. Constituent circuits of the AC/DC converter located on the secondary side of the first transformer and constituent circuits of the DC/DC converter are mounted on the lower face of the cooling chassis.

5 Claims, 6 Drawing Sheets

POWER CONVERSION APPARATUS

CROSS-REFERENCE TO RELATED APPLICATION

This application is based on Japanese Patent Application No. 2014-244744 filed with the Japan Patent Office on Dec. 3, 2014, the entire contents of which are incorporated herein by reference.

FIELD

The disclosure relates to a power conversion apparatus provided with an AC/DC converter which converts an AC voltage supplied from the outside to a DC voltage and a DC/DC converter which converts a DC voltage output from the AC/DC converter to a different DC voltage.

BACKGROUND

An electric car or a hybrid car is provided with a high-voltage battery as a driving source for a drive motor, an AC/DC converter (charger), and a DC/DC converter. The AC/DC converter converts an AC voltage supplied from an external commercial AC power supply to a DC voltage and charges the high-voltage battery with the DC voltage. The DC/DC converter converts a high DC voltage from the AC/DC converter or the high-voltage battery to a low voltage and supplies the low voltage to an auxiliary machine. The auxiliary machine includes, for example, a car navigation system and lamplights which are driven with a low voltage.

For example, as described in JP 2014-3750 A, an AC/DC converter mainly includes a filter circuit, a power factor correction circuit, a full bridge circuit, a transformer, and a rectifier circuit. A DC/DC converter mainly includes a filter circuit, a full bridge circuit, a transformer, and a rectifier circuit. The AC/DC converter, the DC/DC converter, and a control unit that controls the AC/DC converter and the DC/DC converter together constitute a single power conversion apparatus.

On the other hand, for example, JP 2009-27901 A, JP 2013-211943 A, and JP 2013-99053 A each disclose a power conversion apparatus in which a power module (for example, an inverter) for driving a drive motor, a DC/DC converter, and a cooling body that cools the power module and the DC/DC converter are integrated. A flow path through which a coolant flows is formed inside the cooling body. The DC/DC converter is mounted on the upper face of the cooling body. The power module is mounted on the lower face of the cooling body.

An AC/DC converter, a DC/DC converter, and a power module differ in the number of electric circuits and electronic components and also in the area occupied by the electric circuits and the electronic components. Thus, when the DC/DC converter is mounted on either the upper face or the lower face of the cooling body and the power module is mounted on the other face as disclosed in JP 2009-27901 A, JP 2013-211943 A, and JP 2013-99053 A, it is necessary to design the size in the width direction of the cooling body and the apparatus in accordance with the face having a larger number of electric circuits and electronic components. This interferes with downsizing of the apparatus.

SUMMARY

An object of the disclosure is, in a power conversion apparatus provided with an AC/DC converter and a DC/DC converter, to efficiently cool both the AC/DC converter and the DC/DC converter and, at the same time, achieve downsizing.

A power conversion apparatus according to one or more embodiments of the disclosure includes an AC/DC converter configured to convert an AC voltage supplied from the outside to a DC voltage, a DC/DC converter configured to convert a DC voltage output from the AC/DC converter to a different DC voltage, and a cooling body configured to cool both the AC/DC converter and the DC/DC converter. The AC/DC converter includes a first filter circuit to which an AC voltage supplied from the outside is input, a power factor correction circuit connected to an output side of the first filter circuit, a first switching circuit connected to an output side of the power factor correction circuit, a first transformer having a primary side connected to an output side of the first switching circuit, and a first rectifier circuit connected to a secondary side of the first transformer. The DC/DC converter includes a second filter circuit to which a DC voltage output from the AC/DC converter is input, a second switching circuit connected to an output side of the second filter circuit, a second transformer having a primary side connected to an output side of the second switching circuit, and a second rectifier circuit connected to a secondary side of the second transformer. Constituent circuits of the AC/DC converter located on the primary side of the first transformer are mounted on an upper face of the cooling body. Constituent circuits of the AC/DC converter located on the secondary side of the first transformer and constituent circuits of the DC/DC converter are mounted on a lower face of the cooling body.

In one or more embodiments of the disclosure, the AC/DC converter, the DC/DC converter, and the cooling body are integrated to constitute the power conversion apparatus. In addition, the constituent circuits located on the primary side of the first transformer of the AC/DC converter which has more constituent circuits than the DC/DC converter are mounted on the upper face of the cooling body. Further, the constituent circuits located on the secondary side of the first transformer of the AC/DC converter and the constituent circuits of the DC/DC converter are mounted on the lower face of the cooling body. Thus, it is possible to reduce the difference between an area occupied by the electric circuits and the electronic components mounted on the upper face of the cooling body and an area occupied by the electric circuits and the electronic components mounted on the lower face thereof. Accordingly, it is possible to reduce useless spaces on both the upper face and the lower face of the cooling body to reduce the size in the width direction of the cooling body and the power conversion apparatus. Further, it is also possible to reduce the difference in the heat generation amount between the upper face side and the lower face side of the cooling body to efficiently cool both the AC/DC converter and the DC/DC converter by the cooling body. Further, the primary side and the secondary side of the first transformer are electrically insulated. Thus, the constituent circuits located on the primary side of the first transformer of the AC/DC converter and the constituent circuits located on the secondary side thereof can be easily mounted separately on the upper face and the lower face of the cooling body. Thus, there is no electric circuit trouble.

In one or more embodiments of the disclosure, in the power conversion apparatus, the first transformer may be mounted on the upper face or the lower face of the cooling body. The cooling body may cool the circuits by using, for example, a coolant. Alternatively, a cooling body having a heat dissipation property that uses a material having a high thermal conductivity may diffuse heat generated from the constituent circuits.

In one or more embodiments of the disclosure, the power conversion apparatus may further include an upper board attached to the upper face of the cooling body and a lower board attached to the lower face of the cooling body. Some of electronic components located on the primary side of the first transformer of the AC/DC converter may be mounted on the upper face of the cooling body with the upper board interposed therebetween. Some of electronic components located on the secondary side of the first transformer of the AC/DC converter and some of electronic components of the DC/DC converter may be mounted on the lower face of the cooling body with the lower board interposed therebetween.

In one or more embodiments of the disclosure, the power conversion apparatus may further include a first controller configured to control operation of the AC/DC converter and a second controller configured to control operation of the DC/DC converter. The first controller may be mounted on the upper board, and the second controller may be mounted on the lower board.

In one or more embodiments of the disclosure, in the power conversion apparatus, the AC/DC converter may be configured to convert an AC voltage supplied from the outside to a DC voltage for charging a high-voltage battery for a vehicle. The DC/DC converter may be configured to convert a DC voltage output from the AC/DC converter to a DC voltage for driving an auxiliary machine for the vehicle. The high-voltage battery may be charged with the DC voltage output from the AC/DC converter, and the DC voltage output from the DC/DC converter may be supplied to the auxiliary machine.

The disclosure makes it possible, in a power conversion apparatus provided with an AC/DC converter and a DC/DC converter, to efficiently cool both the AC/DC converter and the DC/DC converter and, at the same time, achieve downsizing.

DETAILED DESCRIPTION

Figure 1:
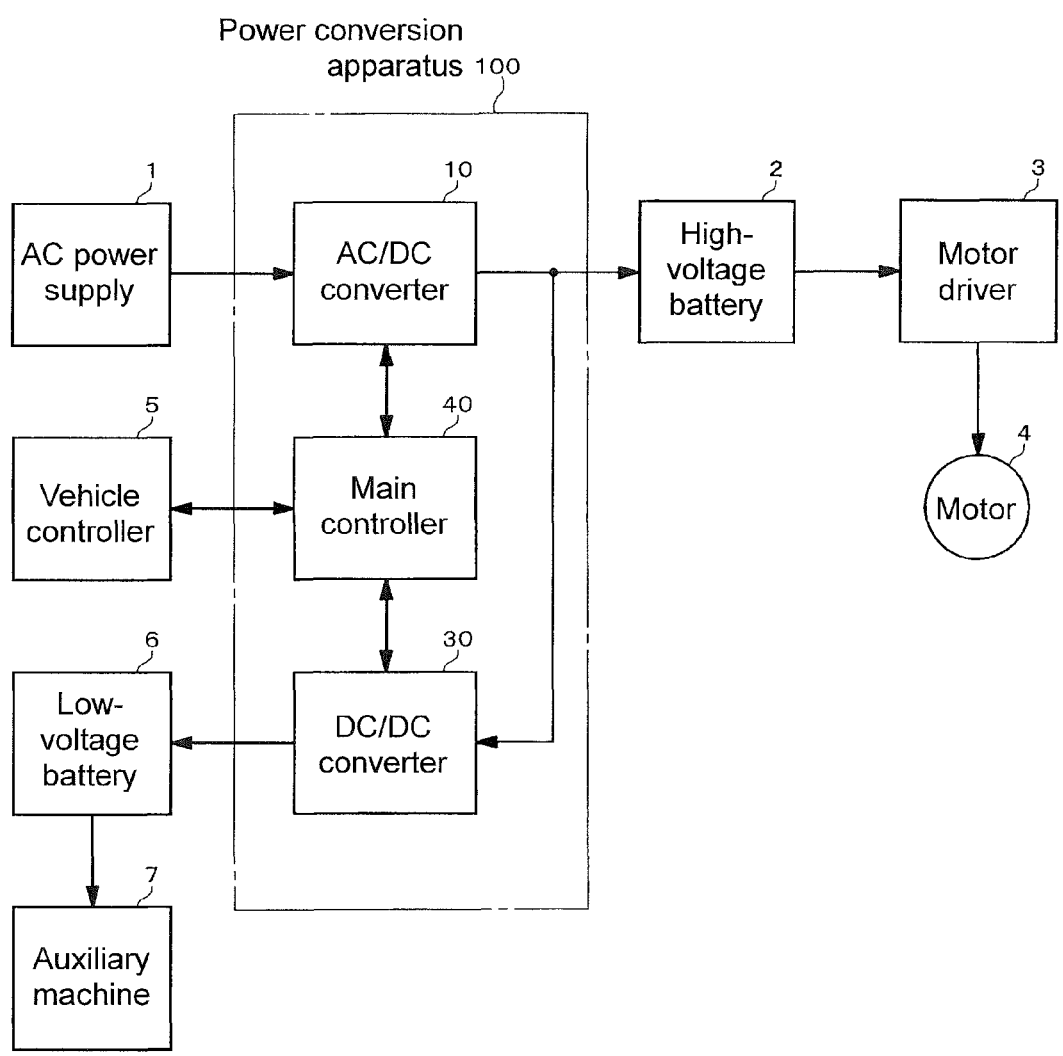
FIG. 1 is a system configuration diagram of an electric car equipped with a power conversion apparatus according to one or more embodiments of the disclosure.

Embodiments of the disclosure will be described with reference to the drawings. In the drawings, the identical or equivalent component is designated by the identical numeral. In embodiments of the disclosure, numerous specific details are set forth in order to provide a more through understanding of the invention. However, it will be apparent to one of ordinary skill in the art that the invention may be practiced without these specific details. In other instances, well-known features have not been described in detail to avoid obscuring the invention. Hereinbelow, an example in which the disclosure is applied to an electric car will be described.

First, a system configuration of an electric car that is equipped with a power conversion apparatus 100 in one or more embodiments of the disclosure will be described with reference to FIG. 1.

The power conversion apparatus 100 includes an AC/DC converter 10, a DC/DC converter 30, and a main controller 40. The AC/DC converter 10, the DC/DC converter 30, and the main controller 40 are integrated and housed in a case (not illustrated).

The AC/DC converter 10 converts an AC voltage (for example, AC85 to 264 [V]) supplied from an external AC power supply 1 to a DC voltage (for example, DC180 to 450 [V]) for charging a high-voltage battery 2 for a vehicle. The high-voltage battery 2 includes a secondary battery such as a lithium ion battery. A voltage of the high-voltage battery 2 is supplied to a motor 4 for vehicle drive through a motor driver 3.

The DC/DC converter 30 converts a DC voltage output from the AC/DC converter 10 to a DC voltage (for example, DC10 to 15 [V]) for driving an auxiliary machine 7 for the vehicle. A low-voltage battery 6 for the auxiliary machine includes a secondary battery such as a lead storage battery. The low-voltage battery 6 is charged with the DC voltage output from the DC/DC converter 30. The auxiliary machine 7 is driven by using the low-voltage battery 6 as a power source. The auxiliary machine 7 is a low-voltage load which is driven by a voltage lower than a voltage for driving the motor 4. The auxiliary machine 7 includes various devices including an interior lamp, a power window device, a wiper device, an audio device, and a navigation system.

The main controller 40 includes a microcomputer such as a digital signal processor (DSP). The main controller 40 allows the AC/DC converter 10 to convert an AC voltage from the AC power supply 1 to a predetermined DC voltage and charges the high-voltage battery 2 with the converted DC voltage. The AC/DC converter 10 is a charger for the high-voltage battery 2. The main controller 40 allows the DC/DC converter 30 to convert a DC voltage output from the AC/DC converter 10 to a predetermined DC voltage and supplies the converted DC voltage to the auxiliary machine 7 through the low-voltage battery 6.

The main controller 40 is connected to a vehicle controller 5 through a control area network (CAN) communication bus. The main controller 40 executes a predetermined control operation in accordance with a signal from the vehicle controller 5.

Next, a circuit configuration of the power conversion apparatus 100 will be described with reference to FIG. 2.

First, the AC/DC converter 10 will be described in detail. The AC/DC converter 10 mainly includes an input unit 11, a protection circuit 12, an input filter 13, an inrush preventing circuit 14, a power factor correction (PFC) circuit 15, a first full bridge circuit 16, a first transformer 17, a first rectifier circuit 18, a smoothing filter 19, an output filter 21, an output unit 22, and a sub controller 20.

The input unit 11 includes a connector to which the AC power supply 1 illustrated in FIG. 1 is connected. The protection circuit 12, the input filter 13, and the inrush preventing circuit 14 are disposed in series in a predetermined order between the input unit 11 and the PFC circuit 15.

The protection circuit 12 and the input filter 13 include a reactor and a capacitor. The protection circuit 12 protects the other circuits from an abnormal voltage or current input from the input unit 11. The input filter 13 removes a noise component from an AC voltage input to the input unit 11. The inrush preventing circuit 14 includes a relay. The inrush preventing circuit 14 prevents an abnormal inrush current from flowing to the PFC circuit 15 from the input unit 11. The input filter 13 is an example of a "first filter circuit" in one or more embodiments of the disclosure.

In addition to the above, for example, a rectifier circuit that includes four bridge-connected diodes may be disposed between the input unit 11 and the PFC circuit 15. Alternatively, a smoothing circuit that includes a capacitor may be disposed.

The PFC circuit 15 is a known circuit that includes a reactor, a diode, a capacitor, and a MOS-FET. The PFC circuit 15 is connected to the output side of the input filter 13. The PFC circuit 15 raises and rectifies an input voltage to, for example, DC 390 [V] and brings the waveform of an input current close to a sinusoidal wave to improve the power factor by an on/off operation of the MOS-FET. The PFC circuit 15 may use a semiconductor switching element other than the MOS-FET.

The first full bridge circuit 16 is a known circuit that includes four H bridge-connected MOS-FETs. The first full bridge circuit 16 is connected to the output side of the PFC circuit 15. The primary side of the first transformer 17 is connected to the output side of the first full bridge circuit 16. A DC voltage output from the PFC circuit 15 is DC/DC converted by an on/off operation of the MOS-FETs of the first full bridge circuit 16. Then, the first transformer 17 outputs a predetermined DC voltage. The DC voltage output from the first transformer 17 is, for example, DC180 [V] to DC450 [V]. The first full bridge circuit 16 may use a semiconductor switching element other than the MOS-FET. The first full bridge circuit 16 is an example of a "first switching circuit" in one or more embodiments of the disclosure. As another example, a half bridge circuit may be used as the first switching circuit.

The first rectifier circuit 18 is a known full-wave rectifier circuit that includes four bridge-connected diodes. The first rectifier circuit 18 is connected to the secondary side of the first transformer 17. The smoothing filter 19 includes a reactor and a capacitor. A DC voltage output from the first transformer 17 is rectified by the first rectifier circuit 18 and smoothed by the smoothing filter 19.

The output filter 21 includes a reactor and a capacitor. The output filter 21 removes a noise component from the DC voltage smoothed by the smoothing filter 19. The output unit 22 includes a connector to which the high-voltage battery 2 illustrated in FIG. 1 is connected. A DC voltage output from the output filter 21 is supplied to the high-voltage battery 2 through the output unit 22.

The sub controller 20 includes a microcomputer such as a digital signal processor (DSP). The sub controller 20 controls the operation of the PFC circuit 15 and the operation of the first full bridge circuit 16. Specifically, the sub controller 20 drives each of the MOS-FETs provided in the PFC circuit 15 and the first full bridge circuit 16 by a pulse width modulation (PWM) signal to control on/off thereof. The sub controller 20 is an example of a "first controller" in one or more embodiments of the disclosure.

In addition to the above, the AC/DC converter 10 is provided with a circuit for driving the MOS-FETs of the PFC circuit 15 and the first full bridge circuit 16, a circuit that detects input and output (current and voltage) of the PFC circuit 15, and a circuit that detects output (voltage) of the smoothing filter 19.

Next, the DC/DC converter 30 will be described in detail. The DC/DC converter 30 includes an input filter 31, a second full bridge circuit 32, a second transformer 33, a second rectifier circuit 34, a smoothing filter 35, and an output unit 36.

A DC voltage output from the smoothing filter 19 of the AC/DC converter 10 is input to the input filter 31. The input filter 31 removes a noise component included in the input DC voltage. The input filter 31 is an example of a "second filter circuit" in one or more embodiments of the disclosure.

The second full bridge circuit 32 is a known circuit that includes four H bridge-connected MOS-FETs. The second full bridge circuit 32 is connected to the output side of the input filter 31. The primary side of the second transformer 33 is connected to the output side of the second full bridge circuit 32. A DC voltage output from the input filter 31 is DC/DC converted so as to be lowered by an on/off operation of the MOS-FETs of the second full bridge circuit 32. Then, the second transformer 33 outputs a predetermined DC voltage. The DC voltage output from the second transformer 33 is, for example, DC10 [V] to DC15 [V]. The second full bridge circuit 32 may use a semiconductor switching element other than the MOS-FET. The second full bridge circuit 32 is an example of a " second switching circuit" in one or more embodiments of the disclosure. As another example, a half bridge circuit may be used as the second switching circuit.

The second rectifier circuit 34 is a known rectifier circuit that includes a diode. The second rectifier circuit 34 is connected to the secondary side of the second transformer 33. As another example, the second rectifier circuit 34 may include a synchronous rectifier circuit that includes a pair of MOS-FETs and a pair of diodes. In this case, the second rectifier circuit 34 performs a switching operation in synchronization with a switching operation of the MOS-FETs of the second full bridge circuit 32.

The smoothing filter 35 includes a reactor and a capacitor. A DC voltage rectified by the second rectifier circuit 34 is smoothed by the smoothing filter 35. The output unit 36 includes a connector to which the low-voltage battery 6 illustrated in FIG. 1 is connected. A DC voltage output from the smoothing filter 35 is supplied to the low-voltage battery 6 through the output unit 36. The DC voltage output from the output unit 36 is lower than the DC voltage output from the output unit 22.

In addition to the above, the DC/DC converter 30 is provided with a circuit for driving the MOS-FETs of the second full bridge circuit 32, a circuit that detects input (current or voltage) to the second full bridge circuit 32, and a circuit that detects output (voltage) from the smoothing filter 35.

Figure 2:
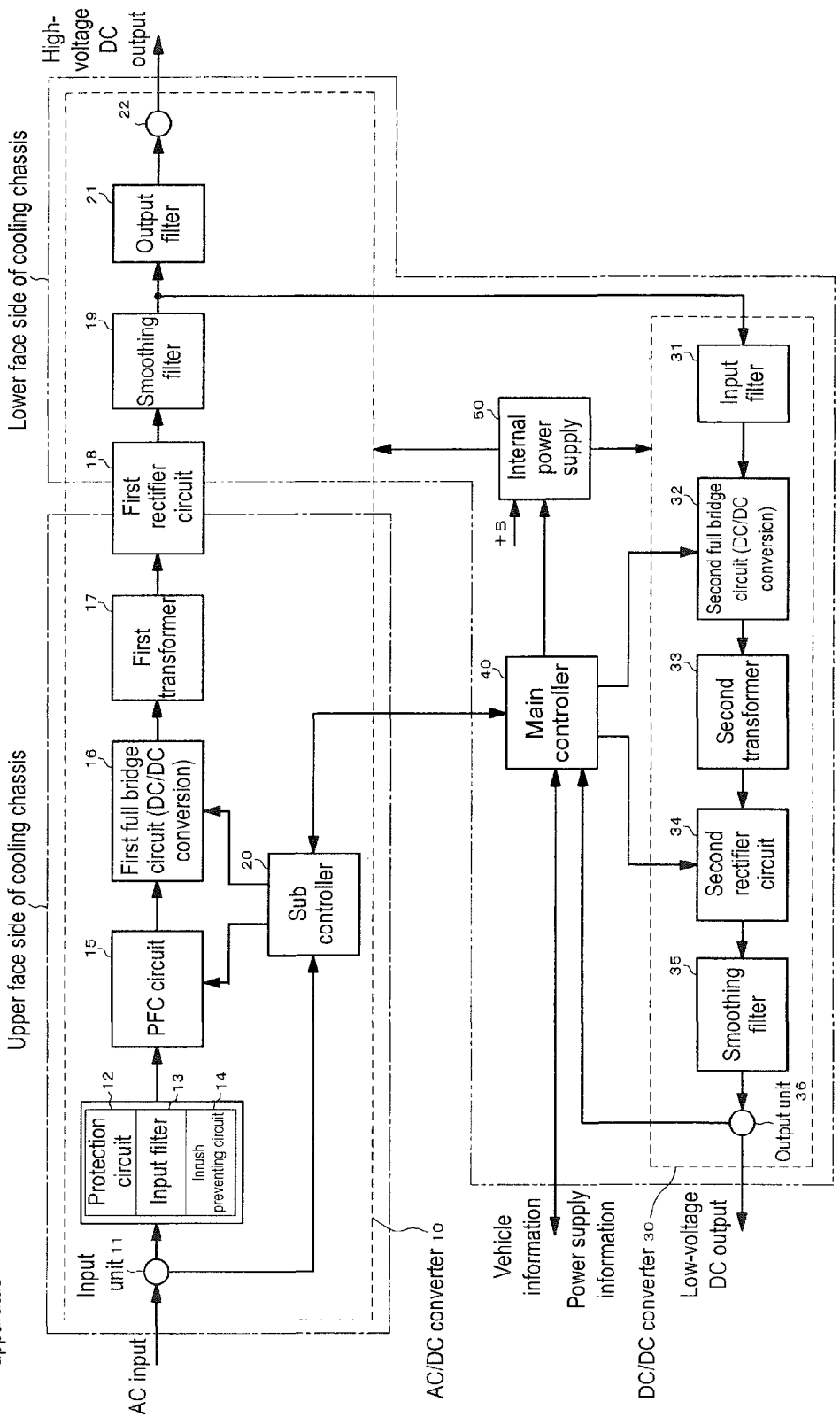
FIG. 2 is a block diagram illustrating a circuit configuration of the power conversion apparatus according to one or more embodiments of the disclosure.

As illustrated in FIG. 2, the number of constituent circuits 12 to 21 of the AC/DC converter 10 (ten) is larger than the number of constituent circuits 31 to 35 of the DC/DC converter 30 (five). Even when the drive circuits for the MOS-FETs and the input/output detection circuits (not illustrated) described above are taken into consideration, the number of constituent circuits of the AC/DC converter 10 is larger than the number of constituent circuits of the DC/DC converter 30.

The main controller 40 is provided with a communication circuit for communicating with the vehicle controller 5 (FIG. 1) and an interface for communicating with an external device. The main controller 40 controls the operation of the DC/DC converter 30 in accordance with vehicle information received from the vehicle controller 5 (FIG. 1). Specifically, the main controller 40 drives each of the MOS-FETs of the second full bridge circuit 32 and the second rectifier circuit 34 in the DC/DC converter 30 by a PWM signal to control on/off thereof.

The main controller 40 determines whether the AC power supply 1 (FIG. 1) is connected to the input unit 11 of the AC/DC converter 10. Then, the main controller 40 transmits an operation instruction for the AC/DC converter 10 to the sub controller 20 in accordance with the presence or absence of the connection of the AC power supply 1 and the vehicle information. The sub controller 20 controls the operation of the AC/DC converter 10 in accordance with the operation instruction received from the main controller 40. The main controller 40 is an example of a "second controller" in one or more embodiments of the disclosure.

An internal power supply 50 generates an internal power supply required for driving each component of the power conversion apparatus 100 on the basis of a DC voltage output from the smoothing filter 35 of the DC/DC converter 30.

Next, the structure of the power conversion apparatus 100 will be described with reference to FIGS. 3 to 6, and also with reference to FIGS. 1 and 2 as needed.

Figure 3:
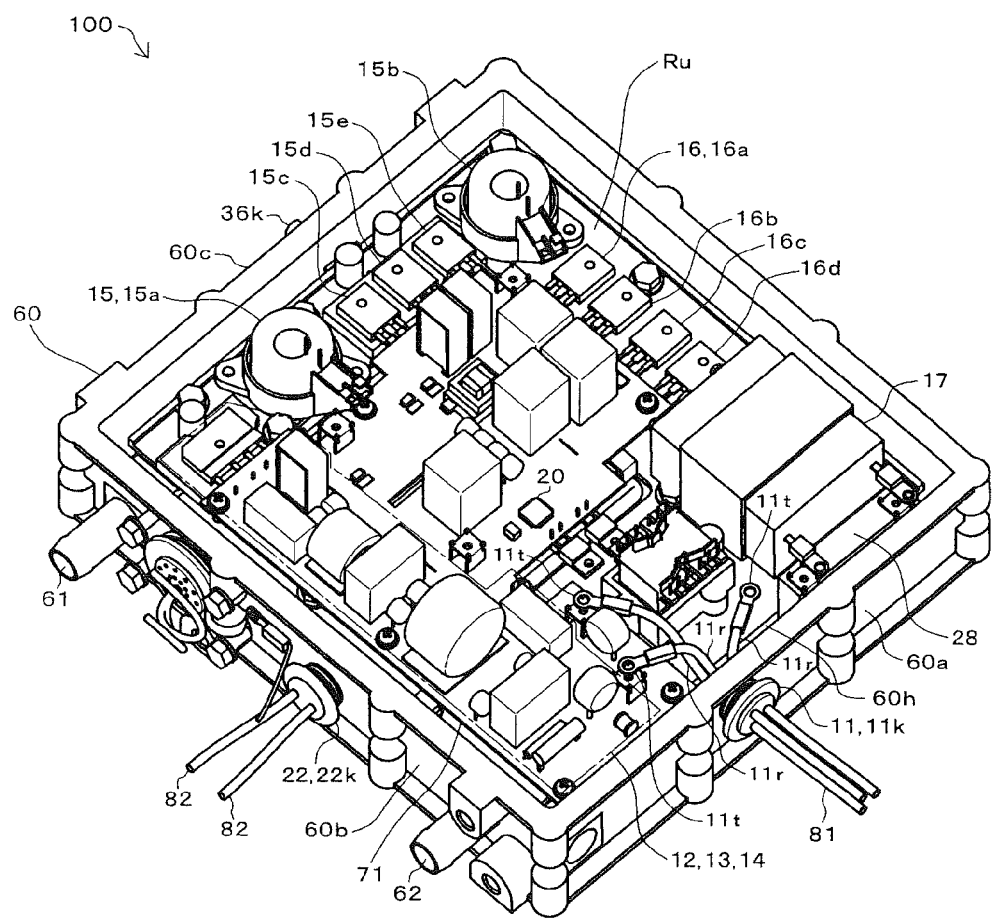
FIG. 3 is a diagram of the power conversion apparatus according to one or more embodiments of the disclosure, viewed from the obliquely upper side.
Figure 4:
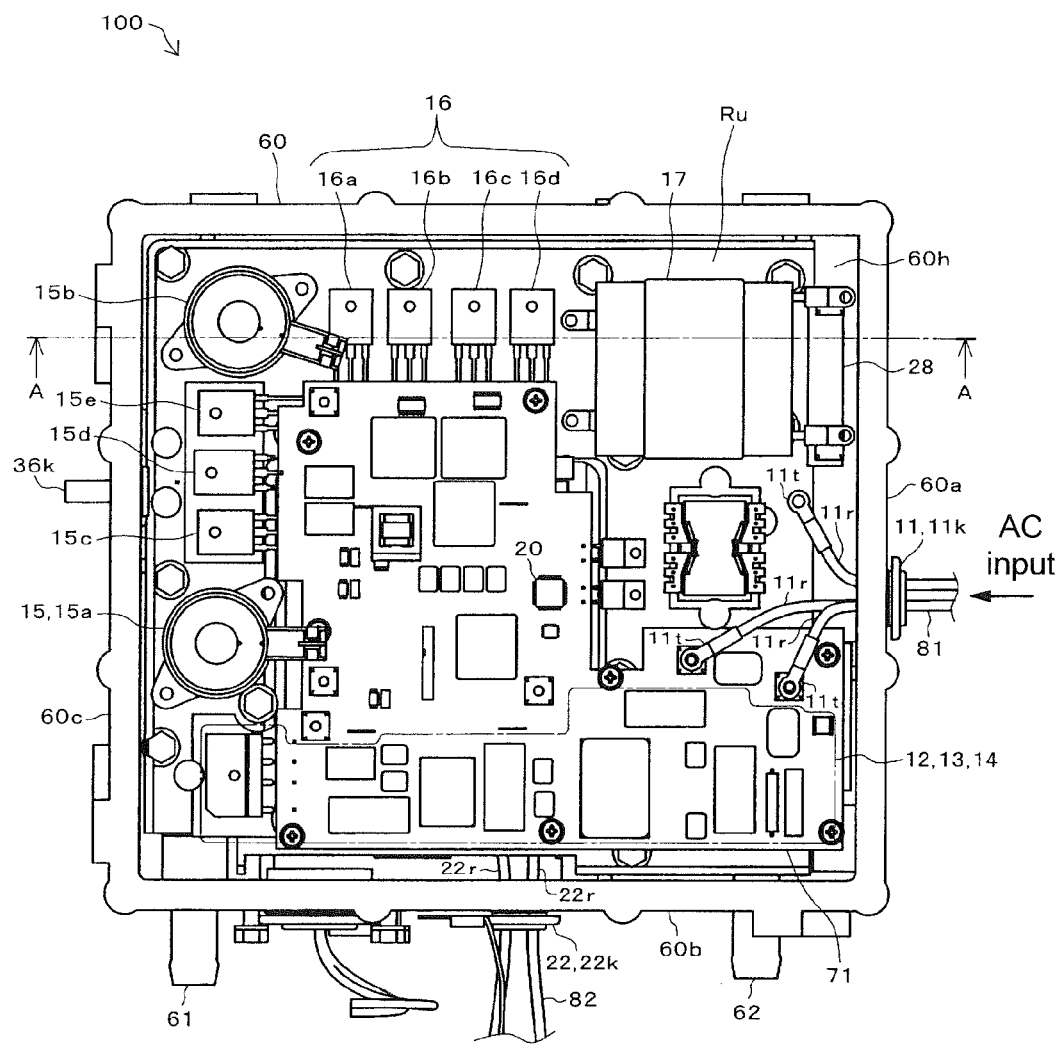
FIG. 4 is a diagram of the power conversion apparatus according to one or more embodiments of the disclosure, viewed from the upper side.
Figure 5:
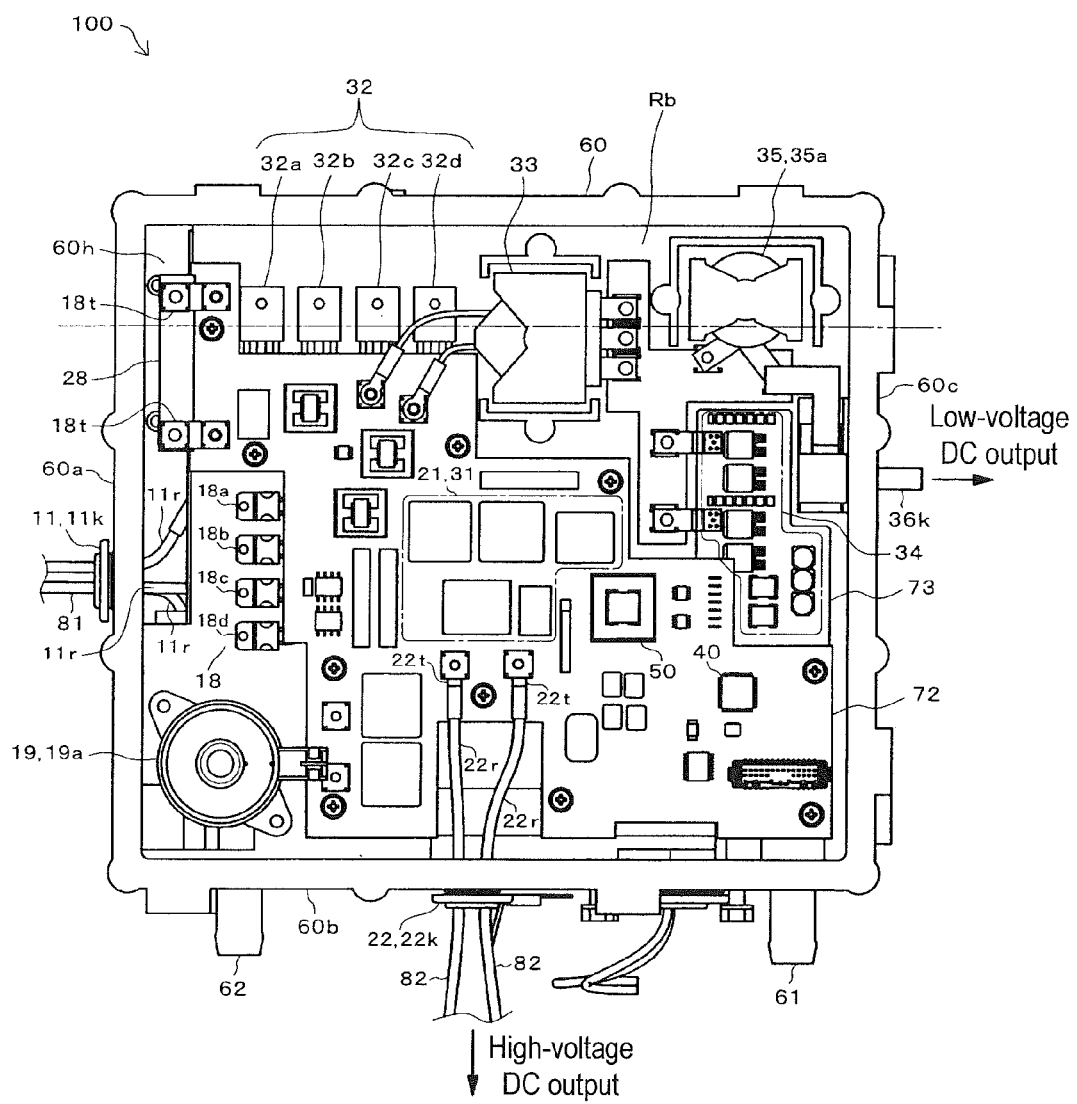
FIG. 5 is a diagram of the power conversion apparatus according to one or more embodiments of the disclosure, viewed from the lower side.
Figure 6:
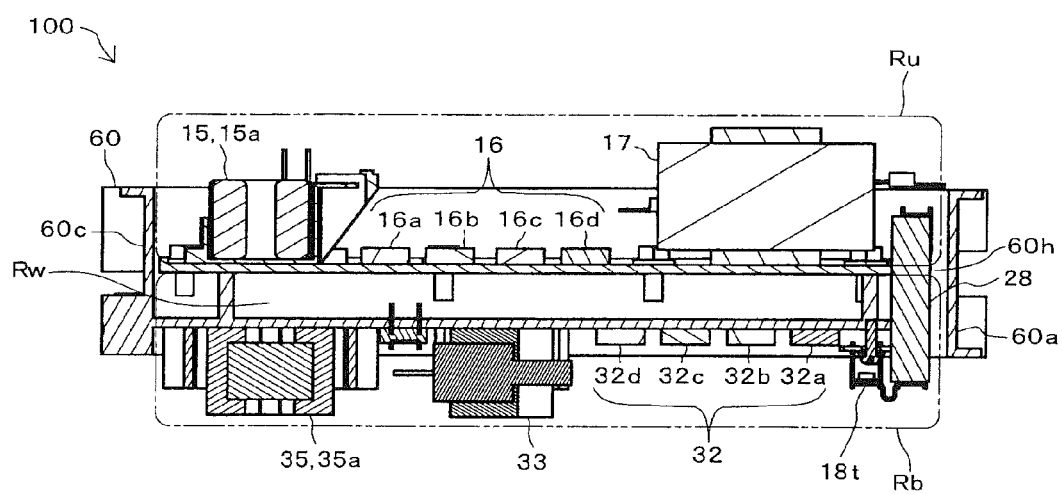
FIG. 6 is a sectional view taken along line A-A of FIG. 4.

FIGS. 3 to 6 are diagrams illustrating the structure of the power conversion apparatus 100. Specifically, FIG. 3 illustrates the power conversion apparatus 100 viewed from the obliquely upper side. FIG. 4 illustrates the power conversion apparatus 100 viewed from the upper side. FIG. 5 illustrates the power conversion apparatus 100 viewed from the lower side. FIG. 6 is a sectional view taken along line A-A of FIG. 4.

The power conversion apparatus 100 is provided with a cooling chassis 60 which is made of aluminum. The cooling chassis 60 has a rectangular shape in plan view (FIGS. 4 and 5) and has a predetermined thickness (FIG. 3).

As illustrated in FIG. 6, the cooling chassis 60 includes a circuit arrangement region Ru located on an upper face side (hereinbelow, referred to as the upper face side circuit arrangement region Ru) and a circuit arrangement region Rb located on a lower face side (hereinbelow, referred to as the lower face side circuit arrangement region Rb). As described below, the components illustrated in FIG. 2 are mounted in the upper face side circuit arrangement region Ru and the lower face side circuit arrangement region Rb.

As illustrated in FIG. 6, a water cooling region Rw is provided on the inner side of the cooling chassis 60, specifically, between the upper face side circuit arrangement region Ru and the lower face side circuit arrangement region Rb. A flow path for a cooling water (not illustrated) is disposed in the water cooling region Rw throughout the cooling chassis 60. As illustrated in FIGS. 3 to 5, a side face 60b of the cooling chassis 60 has an inlet port 61 which allows the cooling water to flow into the flow path and an outlet port 62 which allows the cooling water to flow out of the flow path.

The cooling water circulates between a tank (not illustrated) located outside and the flow path located in the water cooling region Rw of the cooling chassis 60. Accordingly, heat generated in the AC/DC converter 10, the DC/DC converter 30, the internal power supply 50, and the main controller 40 mounted in the upper face side circuit arrangement region Ru and the lower face side circuit arrangement region Rb of the cooling chassis 60 is cooled through the cooling chassis 60. The cooling chassis 60 is an example of a "cooling body" in one or more embodiments of the disclosure.

Some of the constituent circuits of the AC/DC converter 10 illustrated in FIG. 2, specifically, the first transformer 17 and the circuits 12 to 16 located on the primary side of the first transformer 17 and the sub controller 20 are mounted in the upper face side circuit arrangement region Ru of the cooling chassis 60 (within a dot-dash line of FIG. 2).

As illustrated in FIGS. 3 and 4, a fitting part 11k of the connector of the input unit 11 provided in the AC/DC converter 10 is disposed on a side face 60a of the cooling chassis 60. A lead 11r connected to the connector and a terminal 11t are disposed in the upper face side circuit arrangement region Ru of the cooling chassis 60. The terminal 11t is connected to the tip of the lead 11r. The input unit 11 also includes the terminal 11t and the lead 11r. A harness 81 for connecting the AC power supply 1 (FIG. 1) is fitted with the fitting part 11k.

The protection circuit 12, the input filter 13, the inrush preventing circuit 14, the PFC circuit 15, the first full bridge circuit 16, the first transformer 17, and the sub controller 20 of the AC/DC converter 10 are mounted in the upper face side circuit arrangement region Ru of the cooling chassis 60.

Electronic components that generate a relatively large amount of heat including reactors 15a and 15b, MOS-FETs 15c and 15e, and a diode 15d provided in the PFC circuit 15, MOS-FETs 16a to 16d provided in the first full bridge circuit 16, and the first transformer 17 are mounted on the upper face of the cooling chassis 60. A sheet (not illustrated) having an insulating property and a heat transfer property may be interposed between the electronic components that generate a relatively large amount of heat and the cooling chassis 60.

Electronic components that generate a relatively small amount of heat and on-board electronic components including the protection circuit 12, the input filter 13, the inrush preventing circuit 14, the capacitor and the diode provided in the PFC circuit 15, and the sub controller 20 are mounted on the upper face of the cooling chassis 60 with a first board 71 interposed therebetween. Specifically, the electronic components that generate a relatively small amount of heat and the on-board electronic components described above are mounted on the upper face of the first board 71. The first board 71 is fixed on the upper face of the cooling chassis 60. The first board 71 includes, for example, a thick copper foil board. A sheet (not illustrated) having an insulating property and a heat transfer property may be interposed between the first board 71 and the cooling chassis 60. The first board 71 is an example of an "upper board" in one or more embodiments of the disclosure.

In addition to the above, the other circuits and electronic components located on the primary side of the first transformer 17 of the AC/DC converter 10 are mounted in the upper face side circuit arrangement region Ru of the cooling chassis 60. The drive circuit for the MOS-FETs 15c and 15e and the diodes 15d, and 16a to 16d and the input/output detection circuit for the PFC circuit 15 may be disposed on the first board 71.

On the other hand, some of the constituent circuits of the AC/DC converter 10 illustrated in FIG. 2, specifically, the circuits 18, 19, and 21 located on the secondary side of the first transformer 17, the output unit 22, and the constituent circuits 31 to 35 of the DC/DC converter 30 are mounted in the lower face side circuit arrangement region Rb of the cooling chassis 60 (within a dash-dot-dot line of FIG. 2).

As illustrated in FIG. 6, a through hole 60h is formed to vertically penetrate the cooling chassis 60. A component 28 which includes a terminal for connecting the first transformer 17 to the first rectifier circuit 18 is disposed inside the through hole 60h. An input terminal 18t of the first rectifier circuit 18 of the AC/DC converter 10 is connected to the component 28.

As illustrated in FIG. 5, the first rectifier circuit 18, the smoothing filter 19, and the output filter 21 of the AC/DC converter 10 are mounted in the lower face side circuit arrangement region Rb of the cooling chassis 60. Further, the input filter 31, the second full bridge circuit 32, the second transformer 33, the second rectifier circuit 34, and the smoothing filter 35 of the DC/DC converter 30 are also mounted in the lower face side circuit arrangement region Rb. Further, the main controller 40 and the internal power supply 50 are also mounted in the lower face side circuit arrangement region Rb.

A fitting part 22k of the connector of the output unit 22 provided in the AC/DC converter 10 is disposed on the side face 60b of the cooling chassis 60. A lead 22r connected to the connector and a terminal 22t are disposed in the lower face side circuit arrangement region Rb of the cooling chassis 60. The terminal 22t is connected to the tip of the lead 22r. The output unit 22 also includes the terminal 22t and the lead 22r. A harness 82 for connecting the high-voltage battery 2 (FIG. 1) is fitted with the fitting part 22k.

A fitting part 36k of the connector of the output unit 36 provided in the DC/DC converter 30 is disposed on a side face 60c of the cooling chassis 60. A harness (not illustrated) for connecting the low-voltage battery 6 (FIG. 1) is fitted with the fitting part 36k.

Electronic components that generate a relatively large amount of heat including diodes 18a to 18d provided in the first rectifier circuit 18, a reactor 19a provided in the smoothing filter 19, MOS-FETs 32a to 32d provided in the second full bridge circuit 32, the second transformer 33, and a reactor 35a provided in the smoothing filter 35 are mounted on the lower face of the cooling chassis 60. A sheet (not illustrated) having an insulating property and a heat transfer property may be interposed between the electronic components that generate a relatively large amount of heat and the cooling chassis 60.

Electronic components that generate a relatively small amount of heat and on-board electronic components including the capacitors provided in the input filter 31 and the smoothing filter 35, the internal power supply 50, and the main controller 40 are mounted on the lower face of the cooling chassis 60 with a second board 72 interposed therebetween. An on-board MOS-FET and an on-board diode provided in the second rectifier circuit 34 are mounted on the lower face of the cooling chassis 60 with a third board 73 interposed therebetween. Specifically, the electronic components that generate a relatively small amount of heat and the on-board electronic components described above are mounted on the upper face of the second board 72 and the upper face of the third board 73. The second board 72 and the third board 73 are fixed on the lower face of the cooling chassis 60. The second board 72 and the third board 73 each include, for example, a thick copper foil board. A sheet (not illustrated) having an insulating property and a heat transfer property may be interposed between the second board 72 and the cooling chassis 60 and between the third board 73 and the cooling chassis 60. The second board 72 and the third board 73 are examples of a "lower board" in one or more embodiments of the disclosure.

In addition to the above, the other circuits and electronic components located on the secondary side of the first transformer 17 of the AC/DC converter 10 and the other circuits and boards provided in the DC/DC converter 30 are mounted in the lower face side circuit arrangement region Rb of the cooling chassis 60. The drive circuit for the MOS-FETs 32a to 32d, the input detection circuit for the second full bridge circuit 32, and the output detection circuit for the smoothing filter 35 may be disposed on the second board 72.

Covers (not illustrated) are attached to the upper side and the lower side of the cooling chassis 60. Accordingly, the circuits and the electronic components mounted in the cooling chassis 60 of the power conversion apparatus 100 are covered with the covers. The covers and the cooling chassis 60 together constitute a case of the power conversion apparatus 100.

In an illustrative embodiment, the AC/DC converter 10, the DC/DC converter 30, and the cooling chassis 60 are integrated to constitute the power conversion apparatus 100. In addition, the constituent circuits located on the primary side of the first transformer 17 of the AC/DC converter 10 which has more constituent circuits than the DC/DC converter 30 are mounted on the upper face of the cooling chassis 60. Further, the constituent circuits located on the secondary side of the first transformer 17 of the AC/DC converter 10 and the constituent circuits of the DC/DC converter 30 are mounted on the lower face of the cooling chassis 60.

Thus, it is possible to reduce the difference between an area occupied by the electric circuits and the electronic components mounted on the upper face of the cooling chassis 60 and an area occupied by the electric circuits and the electronic components mounted on the lower face thereof. Accordingly, it is possible to reduce useless spaces on both the upper face and the lower face of the cooling chassis 60 to reduce the size in the width direction of the cooling chassis 60 and the power conversion apparatus 100. Further, it is also possible to reduce the difference in the heat generation amount between the upper face side and the lower face side of the cooling chassis 60 to efficiently cool both the AC/DC converter 10 and the DC/DC converter 30 by the cooling chassis 60.

The primary side and the secondary side of the first transformer 17 of the AC/DC converter 10 are electrically insulated. Thus, the constituent circuits located on the primary side of the transformer 17 of the AC/DC converter 10 and the constituent circuits located on the secondary side thereof can be easily mounted separately on the upper face side and the lower face side of the cooling chassis 60. Thus, there is no electric circuit trouble.

Comparably low DC voltages are applied to the constituent circuits located on the secondary side of the first transformer 17 of the AC/DC converter 10 and the constituent circuits located on the primary side of the second transformer 33 of the DC/DC converter 30. Thus, these constituent circuits are electrically compatible. Accordingly, these constituent circuits can be easily brought close to each other on the lower face of the cooling chassis 60. Further, only the constituent circuits located on the primary side of the first transformer 17 of the AC/DC converter 10 to which a high AC or DC voltage is applied can be easily mounted on the upper face of the cooling chassis 60.

In an illustrative embodiment, the first transformer 17 of the AC/DC converter 10 is mounted on the upper face of the cooling chassis 60. Thus, it is possible to further reduce the difference between the area occupied by the electric circuits and the electronic components on the upper face side of the cooling chassis 60 and the area occupied by the electric circuits and the electronic components on the lower face side thereof. As a result, it is possible to further reduce the size in the width direction of the cooling chassis 60 and the power conversion apparatus 100.

Thus, in the power conversion apparatus 100 provided with the AC/DC converter 10 and the DC/DC converter 30, it is possible to efficiently cool both the AC/DC converter 10 and the DC/DC converter 30 by the cooling chassis 60 and, at the same time, achieve downsizing of the power conversion apparatus 100.

In an illustrative embodiment, some of the electronic components located on the primary side of the first transformer 17 of the AC/DC converter 10 are mounted on the upper face of the cooling chassis 60 with the first board 71 interposed therebetween, while the others are directly mounted on the upper face of the cooling chassis 60. Further, some of the electronic components located on the secondary side of the first transformer 17 of the AC/DC converter 10 and the electronic components of the DC/DC converter 30 are mounted on the lower face of the cooling chassis 60 with the second board 72 or the third board 73 interposed therebetween, while the others are directly mounted on the lower face of the cooling chassis 60.

Thus, some of the electronic components and the circuits of the AC/DC converter 10 and the DC/DC converter 30 can be mounted in each of the first to third boards 71 to 73 in high density. Accordingly, it is possible to achieve further downsizing of the power conversion apparatus 100. The electronic components that generate a large amount of heat of the AC/DC converter 10 and the DC/DC converter 30 are directly mounted on the upper face or the lower face of the cooling chassis 60 with no board interposed therebetween. Accordingly, it is possible to easily transfer heat generated in the electronic components to the cooling chassis 60 to efficiently cool the AC/DC converter 10 and the DC/DC converter 30.

In an illustrative embodiment, the sub controller 20 which controls the operation of the AC/DC converter 10 is mounted on the first board 71. Further, the main controller 40 which controls the operation of the DC/DC converter 30 is mounted on the second board 72. Thus, it is possible to control the operations of the PFC circuit 15 and the first full bridge circuit 16 of the AC/DC converter 10 by the sub controller 20 on the upper face side of the cooling chassis 60. Further, it is possible to control the operations of the second full bridge circuit 32 and the second rectifier circuit 34 of the DC/DC converter 30 by the main controller 40 on the lower surface side of the cooling chassis 60.

Further, it is possible to reduce the length of a wiring line that connects the sub controller 20 to the PFC circuit 15 and the length of a wiring line that connects the sub controller 20 to the first full bridge circuit 16 on the upper face side of the cooling chassis 60. Further, it is possible to reduce the length of a wiring line that connects the main controller 40 to the second full bridge circuit 32 and the length of a wiring line that connects the main controller 40 to the second rectifier circuit 34 on the lower face side of the cooling chassis 60.

The sub controller 20 controls the operation of the AC/DC converter 10, and the main controller 40 controls the operation of the DC/DC converter 30. Thus, a processing load on the sub controller 20 and a processing load on the main controller 40 can be reduced compared to a case in which a single controller controls both the AC/DC converter 10 and the DC/DC converter 30.

In one or more embodiments of the disclosure, various embodiments other than an illustrative embodiment may be employed. For example, although there has been described an example in which the first transformer 17 of the AC/DC converter 10 is mounted on the upper face of the cooling chassis 60 as the cooling body in an illustrative embodiment, the disclosure is not limited only thereto. The first transformer 17 of the AC/DC converter 10 may be mounted on the lower face of the cooling chassis 60 taking into consideration the number of circuits and the number of electronic components of the AC/DC converter 10 and the DC/DC converter 30 and the occupied area thereof. Further, some of the electronic components located on the secondary side of the first transformer 17 of the AC/DC converter 10 may be mounted on the upper face of the cooling chassis 60, and the others may be mounted on the lower face of the cooling chassis 60.

In an illustrative embodiment, there has been described an example in which the sub controller 20 controls the AC/DC converter 10 and the main controller 40 controls the DC/DC converter 30. However, the disclosure is not limited only thereto. A single controller may control both the AC/DC converter 10 and the DC/DC converter 30.

In an illustrative embodiment, there has been described an example in which the single first board 71 is attached to the upper face of the cooling chassis 60, and the two second and third boards 72 and 73 are attached to the lower face of the cooling chassis 60. However, the disclosure is not limited only thereto. For example, a plurality of boards may be attached to the upper face of the cooling chassis 60, and the electronic components located on the primary side of the first transformer 17 of the AC/DC converter 10 may be mounted on the boards. Further, a single or a plurality of boards may be attached to the lower face of the cooling chassis 60, and the electronic components located on the secondary side of the first transformer 17 of the AC/DC converter 10 and the electronic components of the DC/DC converter 30 may be mounted on the board(s).

In an illustrative embodiment, there has been described an example in which the cooling chassis 60 which has the flow path for a cooling water inside thereof is used as the cooling body. However, the disclosure is not limited only thereto. For example, a cooling body that uses liquid other than water as a coolant may be used. Alternatively, an air-cooled cooling body may be used. Alternatively, a cooling body that is separated from a chassis may be used.

In an illustrative embodiment, there has been described an example in which the present invention is applied to the power conversion apparatus 100 mounted on an electric car. Alternatively, the present invention is also applicable to a power conversion apparatus that is mounted on other vehicles such as a hybrid car or various kinds of equipment.

While the invention has been described with reference to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:
1. A power conversion apparatus comprising:
an AC/DC converter configured to convert an AC voltage supplied from the outside to a DC voltage, the AC/DC converter including
a first filter circuit to which an AC voltage supplied from the outside is input, a power factor correction circuit connected to an output side of the first filter circuit, a first switching circuit connected to an output side of the power factor correction circuit, a first transformer having a primary side connected to an output side of the first switching circuit, and a first rectifier circuit connected to a secondary side of the first transformer;

a DC/DC converter configured to convert a DC voltage output from the AC/DC converter to a different DC voltage, the DC/DC converter including a second filter circuit to which a DC voltage output from the AC/DC converter is input, a second switching circuit connected to an output side of the second filter circuit, a second transformer having a primary side connected to an output side of the second switching circuit, and a second rectifier circuit connected to a secondary side of the second transformer; and a cooling body configured to cool both the AC/DC converter and the DC/DC converter, wherein constituent circuits of the AC/DC converter located on the primary side of the first transformer are mounted on an upper face of the cooling body, and wherein constituent circuits of the AC/DC converter located on the secondary side of the first transformer and constituent circuits of the DC/DC converter are mounted on a lower face of the cooling body.

2. The power conversion apparatus according to claim 1, wherein the first transformer is mounted on the upper face or the lower face of the cooling body.

3. The power conversion apparatus according to claim 2, further comprising:

an upper board attached to the upper face of the cooling body; and a lower board attached to the lower face of the cooling body, wherein some of electronic components located on the primary side of the first transformer of the AC/DC converter are mounted on the upper face of the cooling body with the upper board interposed therebetween, and wherein some of electronic components located on the secondary side of the first transformer of the AC/DC converter and some of electronic components of the DC/DC converter are mounted on the lower face of the cooling body with the lower board interposed therebetween.

4. The power conversion apparatus according to claim 3, further comprising:

a first controller configured to control operation of the AC/DC converter; and a second controller configured to control operation of the DC/DC converter, wherein the first controller is mounted on the upper board, and wherein the second controller is mounted on the lower board.

5. The power conversion apparatus according to claim 4, wherein the AC/DC converter is configured to convert an AC voltage supplied from the outside to a DC voltage for charging a high-voltage battery for a vehicle, wherein the DC/DC converter is configured to convert a DC voltage output from the AC/DC converter to a DC voltage for driving an auxiliary machine for the vehicle, and wherein the high-voltage battery is charged with the DC voltage output from the AC/DC converter, and the DC voltage output from the DC/DC converter is supplied to the auxiliary machine.

* * * * *